(12) United States Patent
Ding et al.

(10) Patent No.: US 11,094,624 B2
(45) Date of Patent: Aug. 17, 2021

(54) SEMICONDUCTOR DEVICE HAVING CAPACITOR

(71) Applicant: Samsung Electronics Co., Ltd., Suwon-si (KR)

(72) Inventors: Shaofeng Ding, Suwon-si (KR); Jeonghoon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/596,074

(22) Filed: Oct. 8, 2019

(65) Prior Publication Data

US 2020/0343178 A1 Oct. 29, 2020

(30) Foreign Application Priority Data

Apr. 23, 2019 (KR) .................. 10-2019-0047063

(51) Int. Cl.
*H01L 23/522* (2006.01)
*H01L 23/532* (2006.01)
(Continued)

(52) U.S. Cl.
CPC .... *H01L 23/5223* (2013.01); *H01L 21/76802* (2013.01); *H01L 21/76843* (2013.01);
(Continued)

(58) Field of Classification Search
CPC ......... H01L 21/76802; H01L 21/76805; H01L 21/76843; H01L 21/7687; H01L 21/76877; H01L 23/5223; H01L 23/5226; H01L 23/53214; H01L 23/53223; H01L 24/03; H01L 24/05; H01L 24/16; H01L 28/40; H01L 28/60; H01L 28/75; H01L 2224/0401; H01L 2224/0557; H01L 2224/16227; H01L 2924/1205; H01L 2924/19041

See application file for complete search history.

(56) References Cited

U.S. PATENT DOCUMENTS 6,750,114 B2    6/2004  Adler et al.
6,881,999 B2    4/2005  Lee et al.
(Continued)

FOREIGN PATENT DOCUMENTS

KR    10-0875171 B1    12/2008
KR    10-1100762 B1    1/2012

*Primary Examiner* — Cheung Lee
(74) *Attorney, Agent, or Firm* — Harness, Dickey & Pierce, P.L.C

(57) ABSTRACT

A semiconductor device includes a first electrode disposed on a substrate. A capacitor dielectric layer is on the first electrode. A second electrode is on the capacitor dielectric layer. A first insulating layer is on the first and second electrodes and the capacitor dielectric layer. A first interconnection structure is on the first insulating layer and connected to the first electrode. A second interconnection structure is on the first insulating layer and connected to the second electrode. A second insulating layer is on the first and second interconnection structures. A plurality of connection structures are configured to pass through the second insulating layer and be connected to the first and second interconnection structures. Each of the first and second interconnection structures has an aluminum layer.

13 Claims, 9 Drawing Sheets

(51) Int. Cl.
*H01L 23/00* (2006.01)
*H01L 49/02* (2006.01)
*H01L 21/768* (2006.01)

(52) U.S. Cl.
CPC .... *H01L 21/76877* (2013.01); *H01L 23/5226* (2013.01); *H01L 23/53223* (2013.01); *H01L 24/03* (2013.01); *H01L 24/05* (2013.01); *H01L 24/16* (2013.01); *H01L 28/60* (2013.01); H01L 2224/0401 (2013.01); H01L 2224/0557 (2013.01); H01L 2224/16227 (2013.01)

(56) References Cited

U.S. PATENT DOCUMENTS

| | | |
|---|---|---|
| 7,078,332 B2 | 7/2006 | Jeong et al. |
| 7,317,221 B2 | 1/2008 | Chang et al. |
| 8,878,338 B2 | 11/2014 | Chang et al. |
| 10,115,719 B2 | 10/2018 | Singh et al. |
| 2008/0224194 A1* | 9/2008 | Sashida ............ H01L 27/11507 257/295 |
| 2011/0039409 A1* | 2/2011 | Arikawa ................. G06F 30/36 438/667 |
| 2013/0207258 A1* | 8/2013 | Chen ........................ H01L 24/05 257/737 |
| 2015/0102461 A1* | 4/2015 | Lee .................... H01L 23/5223 257/532 |
| 2015/0123242 A1* | 5/2015 | Jen ..................... H01L 23/5226 257/532 |
| 2017/0278921 A1* | 9/2017 | Chen ........................ H01L 28/55 |
| 2018/0337122 A1* | 11/2018 | Liao ........................ H01L 24/92 |

* cited by examiner

SEMICONDUCTOR DEVICE HAVING CAPACITOR

CROSS-REFERENCE TO RELATED APPLICATION

This U.S. non-provisional patent application claims priority under 35 U.S.C. § 119 to and the benefit of Korean Patent Application No. 10-2019-0047063, filed on Apr. 23, 2019, in the Korean Intellectual Property Office (KIPO), the disclosure of which is incorporated herein by reference in its entirety.

BACKGROUND

1. Field

Devices and methods consistent with example embodiments relate to a semiconductor device having a capacitor and a method of forming the same.

2. Description of Related Art

Devices such as capacitors require a plurality of interconnection layers which will be connected to external circuits. The plurality of interconnection layers directly affect reliability and/or productivity for a product. An increase in the number of interconnection layers causes degradation of electrical characteristics and/or a decrease in productivity.

SUMMARY

The example embodiments of the inventive concepts are directed to providing a semiconductor device with a simplified manufacturing process and improved reliability of a product, and a method of forming the same.

According to example embodiments, there is provided a semiconductor device which includes a first electrode on a substrate. A capacitor dielectric layer is on the first electrode. A second electrode is on the capacitor dielectric layer. A first insulating layer is on the first and second electrodes and the capacitor dielectric layer. A first interconnection structure is on the first insulating layer and connected to the first electrode. A second interconnection structure is on the first insulating layer and connected to the second electrode. A second insulating layer is on the first and second interconnection structures. A plurality of connection structures are configured to pass through the second insulating layer and be connected to the first and second interconnection structures. Each of the first and second interconnection structures has an aluminum layer.

According to example embodiments, there is provided a semiconductor device which includes a first electrode on a substrate. A capacitor dielectric layer is on the first electrode. A second electrode is on the capacitor dielectric layer. A first insulating layer is on the first and second electrodes and the capacitor dielectric layer. A first interconnection structure is on the first insulating layer and passes through the first insulating layer and connected to the first electrode. A second interconnection structure is on the first insulating layer, pass through the first insulating layer, and is connected to the second electrode. A second insulating layer is on the first and second interconnection structures. First and second pad windows are configured to pass through the second insulating layer and expose the first and second interconnection structures. Each of the first and second interconnection structures has an aluminum layer.

According to example embodiments, there is provided a semiconductor device which includes a first electrode on a substrate. A capacitor dielectric layer is on the first electrode. A second electrode is on the capacitor dielectric layer. A first insulating layer is on the first and second electrodes and the capacitor dielectric layer. A first lower plug structure is configured to pass through the first insulating layer and connect to the first electrode. A second lower plug structure is configured to pass through the first insulating layer and connect to the second electrode. A first interconnection structure is on the first insulating layer and connected to the first lower plug structure. A second interconnection structure is on the first insulating layer and connected to the second lower plug structure. A second insulating layer is on the first and second interconnection structures. First and second pad windows are configured to pass through the second insulating layer and expose the first and second interconnection structures. Each of the first and second interconnection structures has an aluminum layer.

DETAILED DESCRIPTION OF EXAMPLE EMBODIMENTS

FIGS. 1 to 11 are cross-sectional views for describing semiconductor devices according to example embodiments of the inventive concepts. In an example embodiment, the semiconductor device may include decoupling capacitors.

Figure 1:
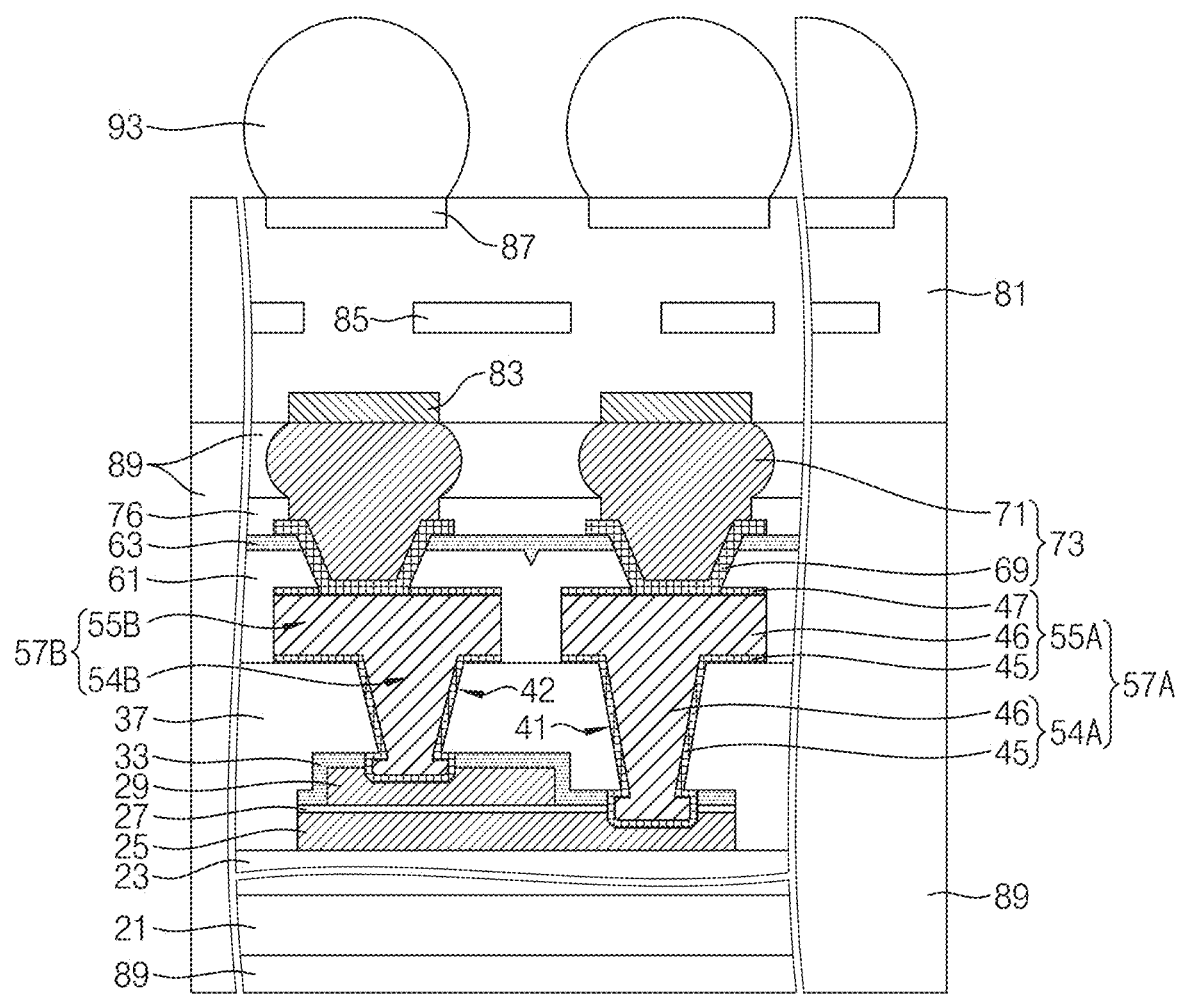
FIGS. 1 to 11 are cross-sectional views for describing semiconductor devices according to example embodiments of the inventive concepts.

Referring to FIG. 1, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, first and second contact holes 41 and 42, first and second interconnection structures 57A and 57B, a second insulating layer 61, a third insulating layer 63, a plurality of connection structures 73, a fourth insulating layer 76, a circuit board 81, a plurality of lower terminals 83, a plurality of internal interconnections 85, a plurality of upper terminals 87, an encapsulant 89, and/or a plurality of external terminals 93.

The lower electrode 25, the capacitor dielectric layer 27, and/or the upper electrode 29 may constitute a capacitor. A plurality of capacitors may be disposed on the substrate 21 in a row direction and a column direction. At least one of the lower electrode 25, the capacitor dielectric layer 27, and/or the upper electrode 29 may include a three-dimensional structure, such as a cylinder-type structure, a pillar-type structure, a box-type structure, a trench-type structure, a screw-type structure, or a combination thereof. In an example embodiment, the lower electrode 25 may be referred to as a first electrode and the upper electrode 29 may be referred to as a second electrode.

The first interconnection structure 57A may include a first plug structure 54A and a first pad structure 55A. The second interconnection structure 57B may include a second plug structure 54B and a second pad structure 55B. Each of the first and second plug structures 54A and 54B may include an aluminum layer 46 and a lower barrier layer 45 which surrounds a bottom and side surfaces of the aluminum layer 46. Each of the first and second pad structures 55A and 55B may include the aluminum layer 46, the lower barrier layer 45 disposed on a lower surface of the aluminum layer 46, and an upper barrier layer 47 disposed on an upper surface of the aluminum layer 46.

Each of the plurality of connection structures 73 may include a under bump metallization (UBM) 69 and a bump 71 disposed on the UBM 69. In an example embodiment, each of the plurality of connection structures 73 may include a bonding wire, a conductive pin, conductive tape, a solder ball, or a combination thereof. Each of the plurality of external terminals 93 may include a ball grid array (BGA), a pin grid array (PGA), a lead grid array (LGA), conductive tape, or a combination thereof.

In an example embodiment, the lower electrode 25 and the upper electrode 29 which face each other may be disposed on the lower insulating layer 23 which covers the substrate 21. The capacitor dielectric layer 27 may be interposed between the lower electrode 25 and the upper electrode 29. For example, the capacitor dielectric layer 27 and the upper electrode 29 may be sequentially stacked on the lower electrode 25. The lower electrode 25 may have a greater width than the upper electrode 29. The upper electrode 29 may overlap at least a portion of the lower electrode 25.

The first etch stop layer 33 may cover side surfaces and an upper surface of the upper electrode 29 and cover the capacitor dielectric layer 27 and the upper electrode 29. The capacitor dielectric layer 27 may remain between the first etch stop layer 33 and the upper electrode 29. The first insulating layer 37 may cover the lower insulating layer 23, the lower electrode 25, the capacitor dielectric layer 27, the upper electrode 29, and the first etch stop layer 33.

The first interconnection structure 57A may be disposed on the first insulating layer 37 and connected to the lower electrode 25. The second interconnection structure 57B may be disposed on the first insulating layer 37 and connected to the upper electrode 29. The first pad structure 55A and the second pad structure 55B may be disposed on the first insulating layer 37.

The first plug structure 54A may pass through the first insulating layer 37, the first etch stop layer 33, and the capacitor dielectric layer 27 and be in direct contact with the lower electrode 25. The aluminum layer 46 in the first pad structure 55A and the aluminum layer 46 in the first plug structure 54A may be an integrated type. The aluminum layer 46 in the first pad structure 55A and the aluminum layer 46 in the first plug structure 54A may be a continuous material. The aluminum layer 46 in the first plug structure 54A may extend into the lower electrode 25. A lowermost end of the aluminum layer 46 in the first plug structure 54A may be disposed at a lower level than an uppermost end of the lower electrode 25. A distance between the lowermost end of the aluminum layer 46 and the substrate 21 may be smaller than a distance between the uppermost end of the lower electrode 25 and the substrate 21.

The second plug structure 54B may pass through the first insulating layer 37 and the first etch stop layer 33 and be in direct contact with the upper electrode 29. The aluminum layer 46 in the second pad structure 55B and the aluminum layer 46 in the second plug structure 54B may be an integrated type. The aluminum layer 46 in the second pad structure 55B and the aluminum layer 46 in the second plug structure 54B may be a continuous material. The aluminum layer 46 in the second plug structure 54B may extend into the upper electrode 29. A lowermost end of the aluminum layer 46 in the second plug structure 54B may be disposed at a lower level than an uppermost end of the upper electrode 29. A distance between the lowermost end of the aluminum layer 46 and the substrate 21 may be smaller than a distance between the uppermost end of the upper electrode 29 and the substrate 21.

The second insulating layer 61 may be disposed on the first insulating layer 37 to cover the first and second interconnection structures 57A and 57B. The second insulating layer 61 may be in direct contact with side surfaces of the lower barrier layer 45, the aluminum layer 46, and the upper barrier layer 47. The third insulating layer 63 may be disposed on the second insulating layer 61.

Each of the plurality of connection structures 73 may pass through the third insulating layer 63 and the second insulating layer 61 and be connected to a corresponding one of the first and second interconnection structures 57A and 57B. The UBM 69 may pass through the third insulating layer 63, the second insulating layer 61, and/or the upper barrier layer 47 and be in direct contact with the aluminum layer 46. The fourth insulating layer 76 may cover the third insulating layer 63 and cover an edge of the UBM 69. The bump 71 may pass through the fourth insulating layer 76 and be in contact with the UBM 69.

The circuit board 81 may be attached to the plurality of connection structures 73. The bumps 71 may be in contact with the plurality of lower terminals 83. The encapsulant 89 may cover a lower surface of the circuit board 81. The plurality of external terminals 93 may be disposed on an upper surface of the circuit board 81.

Figure 2:
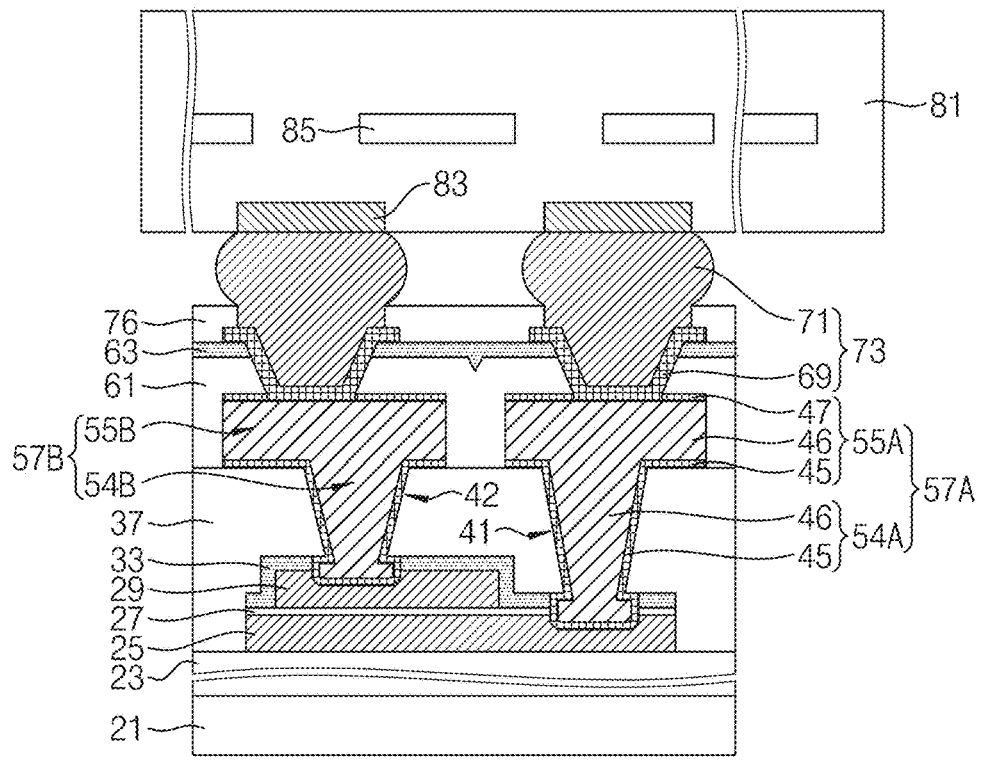

Referring to FIG. 2, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, first and second contact holes 41 and 42, first and second interconnection structures 57A and 57B, a second insulating layer 61, a third insulating layer 63, a plurality of connection structures 73, a fourth insulating layer 76, a circuit board 81, a plurality of lower terminals 83, and/or a plurality of internal interconnections 85. The circuit board 81 may correspond to a main board.

Figure 3:
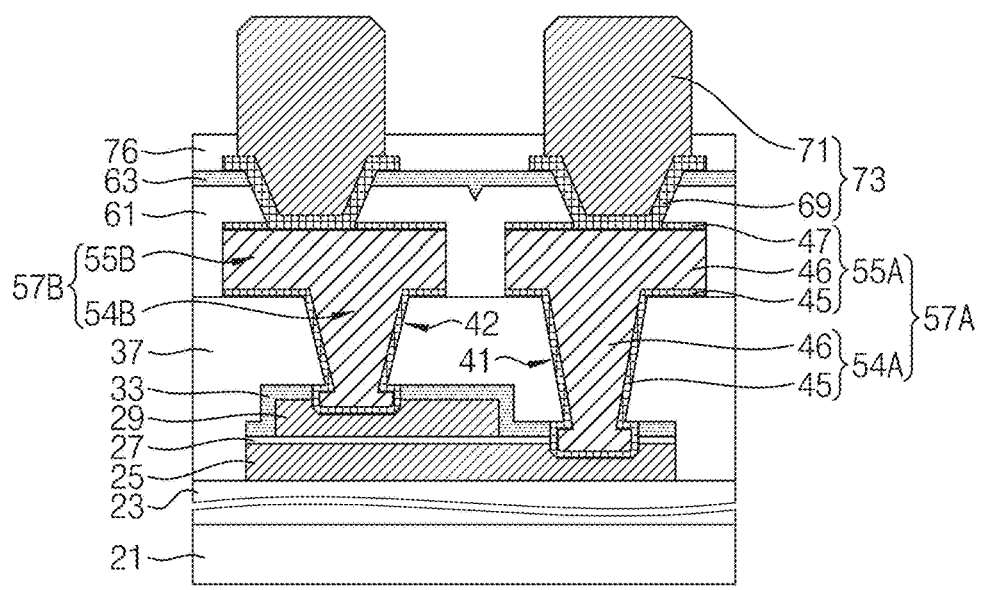

Referring to FIG. 3, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, first and second contact holes 41 and 42, first and second interconnection structures 57A and 57B, a second insulating layer 61, a third insulating layer 63, a plurality of connection structures 73, and/or a fourth insulating layer 76. Each of the plurality of connection structures 73 may protrude to a higher level than the fourth insulating layer 76.

Figure 4:
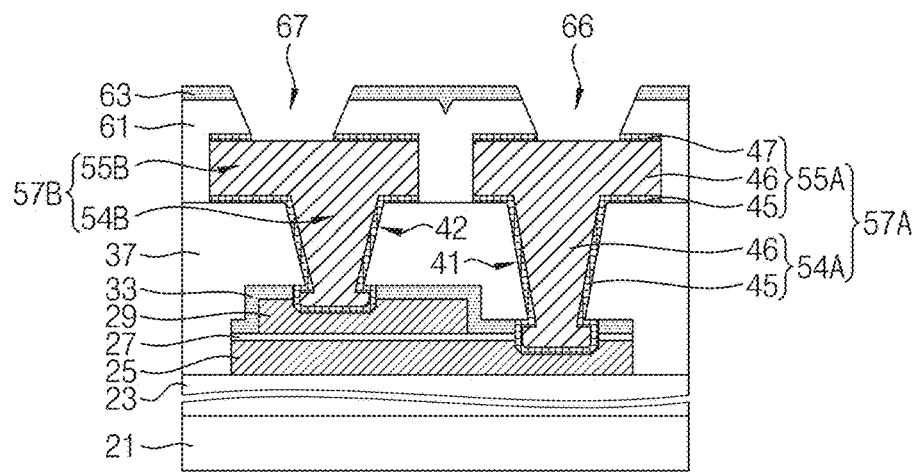

Referring to FIG. 4, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, first and second contact holes 41 and 42, first and second interconnection structures 57A and 57B, a second insulating layer 61, a third insulating layer 63, and/or first and second pad windows 66 and 67. The first and second pad windows 66 and 67 may pass through the third insulating layer 63 and the second insulating layer 61 so that the first and second interconnection structures 57A and 57B may be exposed. In an example embodiment, the first and second pad windows 66 and 67 may pass through the third insulating layer 63, the second insulating layer 61, and an upper barrier layer 47 so that the aluminum layer 46 may be exposed.

Figure 5:
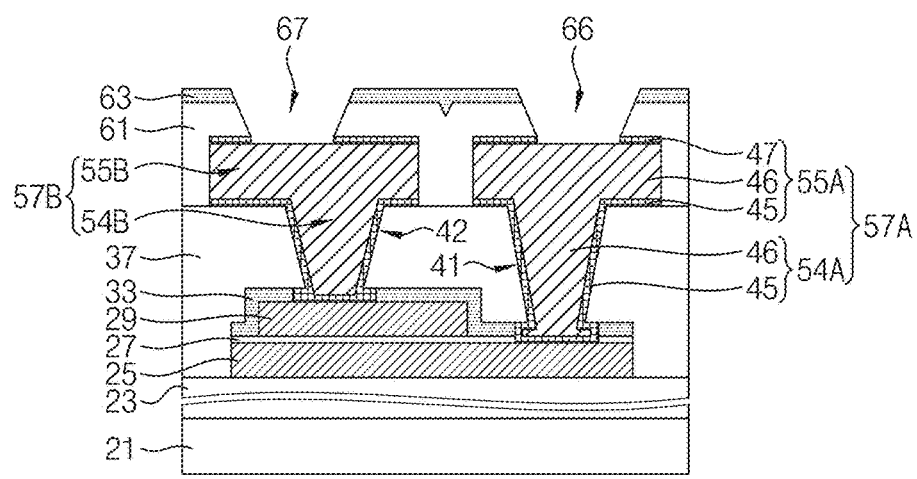

Referring to FIG. 5, a first plug structure 54A may pass through a first insulating layer 37, a first etch stop layer 33, and a capacitor dielectric layer 27 and be in direct contact with an upper surface of a lower electrode 25. A second plug structure 54B may pass through the first insulating layer 37 and the first etch stop layer 33 and be in direct contact with an upper surface of an upper electrode 29.

Figure 6:
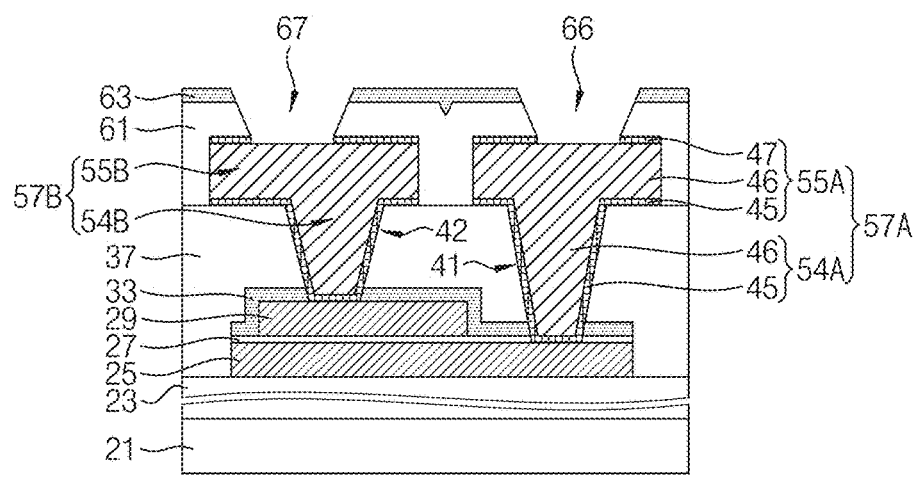

Referring to FIG. 6, each of a first plug structure 54A and a second plug structure 54B may have an inverted trapezoidal shape in which a width of a lower portion is smaller than that of an upper portion.

Figure 7:
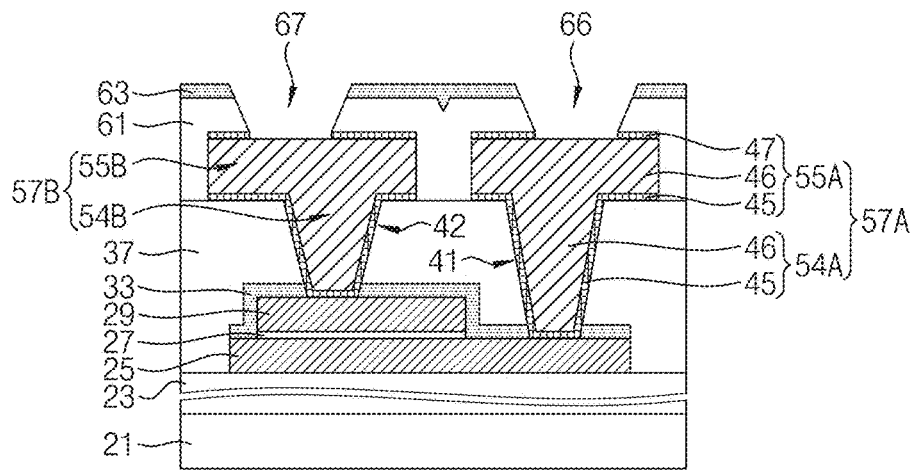

Referring to FIG. 7, a capacitor dielectric layer 27 may remain between a lower electrode 25 and an upper electrode 29. A first etch stop layer 33 may be in contact with an upper surface of and side surfaces of the lower electrode 25, be in contact with side surfaces of the capacitor dielectric layer 27, and be in contact with an upper surface of the upper electrode 29. A first plug structure 54A may pass through a first insulating layer 37 and the first etch stop layer 33 and be in direct contact with the lower electrode 25. A second plug structure 54B may pass through the first insulating layer 37 and the first etch stop layer 33 and be in direct contact with the upper electrode 29.

Figure 8:
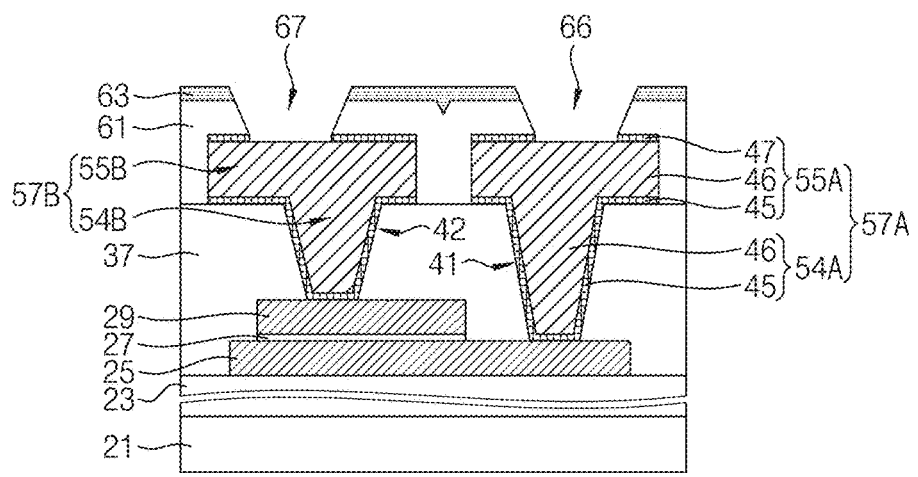

Referring to FIG. 8, a first plug structure 54A may pass through a first insulating layer 37 and be in direct contact with a lower electrode 25. A second plug structure 54B may pass through the first insulating layer 37 and be in direct contact with an upper electrode 29.

Figure 9:
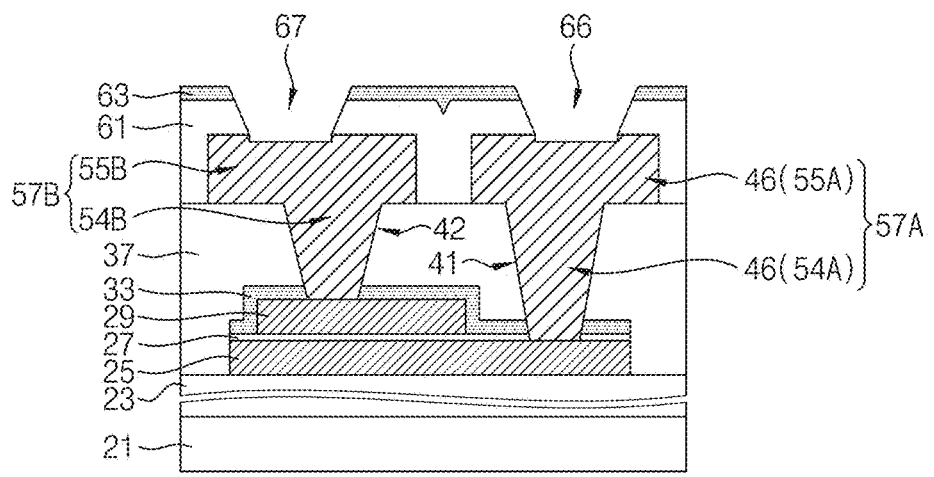

Referring to FIG. 9, a first plug structure 54A and a first pad structure 55A may each include an aluminum layer 46. The aluminum layer 46 may be an integrated type. The aluminum layer 46 may be in direct contact with a lower electrode 25. A second plug structure 54B and a second pad structure 55B may each include an aluminum layer 46. The aluminum layer 46 may be an integrated type. The aluminum layer 46 may be in direct contact with an upper electrode 29.

Figure 10:
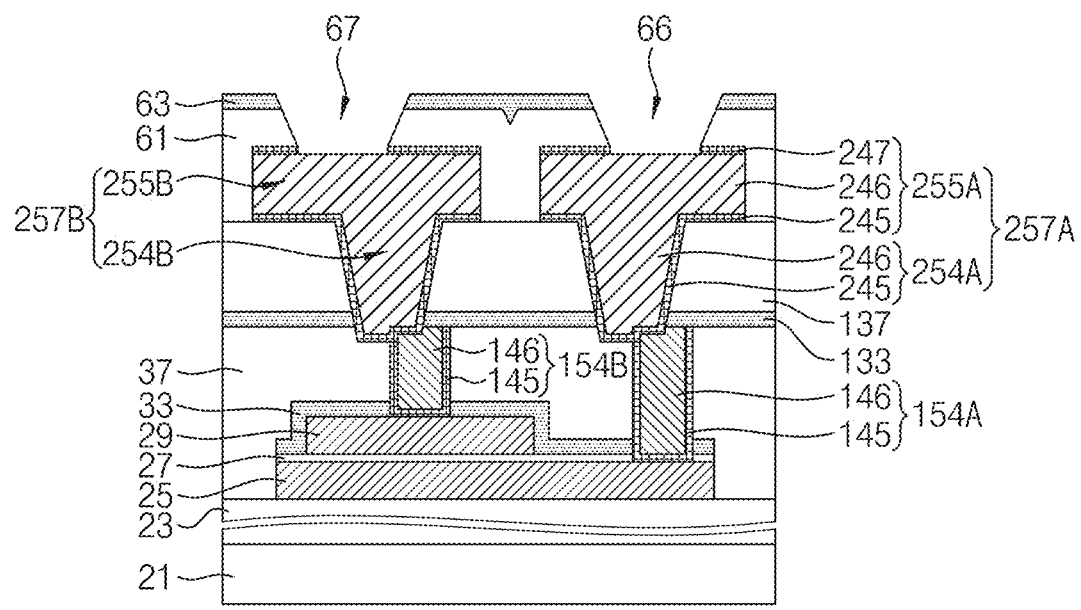

Referring to FIG. 10, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, first and second lower plug structures 154A and 154B, a second etch stop layer 133, a fifth insulating layer 137, first and second interconnection structures 257A and 257B, a second insulating layer 61, a third insulating layer 63, and first and second pad windows 66 and 67.

The first and second lower plug structures 154A and 154B may include materials which are different from the first and second interconnection structures 257A and 257B. Each of the first and second lower plug structures 154A and 154B may include a conductive plug 146 and a barrier layer 145 which surrounds side surfaces and a bottom of the conductive plug 146. The barrier layer 145 may include Ti, TiN, Ta, TaN, or a combination thereof. The conductive plug 146 may include Cu, W, a conductive carbon, or a combination thereof. The first lower plug structure 154A may pass through the first insulating layer 37, the first etch stop layer 33, and the capacitor dielectric layer 27 and be in direct contact with the lower electrode 25. The second lower plug structure 154B may pass through the first insulating layer 37 and the first etch stop layer 33 and be in direct contact with the upper electrode 29.

The second etch stop layer 133 may cover the first insulating layer 37 and the first and second lower plug structures 154A and 154B. The fifth insulating layer 137 may cover the second etch stop layer 133. The fifth insulating layer 137 may include silicon oxide, silicon nitride, silicon oxynitride, low-k dielectrics, high-k dielectrics, or a combination thereof. The second etch stop layer 133 may include a material having an etch selectivity with respect to the fifth insulating layer 137. In an example embodiment, the fifth insulating layer 137 may include silicon oxide and the second etch stop layer 133 may include silicon nitride.

The first interconnection structure 257A may include a first plug structure 254A and a first pad structure 255A. The second interconnection structure 257B may include a second plug structure 254B and a second pad structure 255B. Each of the first and second plug structures 254A and 254B may include an aluminum layer 246 and a lower barrier layer 245 which surrounds a bottom and side surfaces of the aluminum layer 246. Each of the first and second pad structures 255A and 255B may include the aluminum layer 246, the lower barrier layer 245 disposed on a lower surface of the aluminum layer 246, and an upper barrier layer 247 disposed on an upper surface of the aluminum layer 246. The lower barrier layer 245 may be interposed between the aluminum layer 246 and the conductive plug 146.

The first interconnection structure 257A may be disposed on the fifth insulating layer 137 and be connected to the first lower plug structure 154A. The second interconnection structure 257B may be disposed on the fifth insulating layer 137 and be connected to the second lower plug structure 154B. The first pad structure 255A and the second pad structure 255B may be disposed on the fifth insulating layer 137.

The first plug structure 254A may pass through the fifth insulating layer 137 and the second etch stop layer 133 and be in direct contact with the first lower plug structure 154A. The aluminum layer 246 in the first pad structure 255A and the aluminum layer 246 in the first plug structure 254A may be an integrated type. The aluminum layer 246 in the first pad structure 255A and the aluminum layer 246 in the first plug structure 254A may be a continuous material. The second plug structure 254B may pass through the fifth insulating layer 137 and the second etch stop layer 133 and be in direct contact with the second lower plug structure 154B. The aluminum layer 246 in the second pad structure 255B and the aluminum layer 246 in the second plug structure 254B may be an integrated type. The aluminum layer 246 in the second pad structure 255B and the aluminum layer 246 in the second plug structure 254B may be a continuous material.

The second insulating layer 61 may be disposed on the fifth insulating layer 137 to cover the first and second interconnection structures 257A and 257B. The second insulating layer 61 may be in direct contact with side surfaces of the lower barrier layer 245, the aluminum layer 246, and the upper barrier layer 247. The third insulating layer 63 may be disposed on the second insulating layer 61. The first and second pad windows 66 and 67 may pass through the third insulating layer 63 and the second insulating layer 61 so that the first and second interconnection structures 257A and 257B may be exposed.

Figure 11:
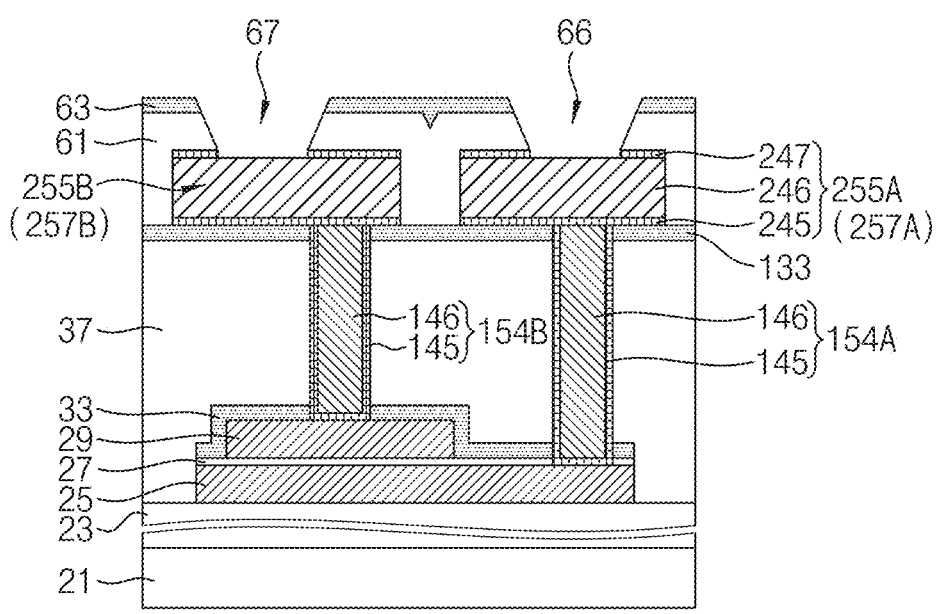

Referring to FIG. 11, a semiconductor device according to an example embodiment of the inventive concepts may include a substrate 21, a lower insulating layer 23, a lower electrode 25, a capacitor dielectric layer 27, an upper electrode 29, a first etch stop layer 33, a first insulating layer 37, a second etch stop layer 133, first and second lower plug structures 154A and 154B, first and second interconnection structures 257A and 257B, a second insulating layer 61, a third insulating layer 63, and/or first and second pad windows 66 and 67.

The second etch stop layer 133 may cover the first insulating layer 37. Each of the first and second lower plug structures 154A and 154B may pass through the second etch stop layer 133 and the first insulating layer 37. Upper surfaces of the second etch stop layer 133 and the first and second lower plug structures 154A and 154B may be substantially coplanar.

The first interconnection structure 257A may include a first pad structure 255A. The second interconnection structure 257B may include a second pad structure 255B. Each of the first and second pad structures 255A and 255B may include an aluminum layer 246, a lower barrier layer 245 disposed on a lower surface of the aluminum layer 246, and an upper barrier layer 247 disposed on an upper surface of the aluminum layer 246. The lower barrier layer 245 may be interposed between the aluminum layer 246 and a conductive plug 146.

The first interconnection structure 257A may be disposed on the second etch stop layer 133 and be connected to the first lower plug structure 154A. The second interconnection structure 257B may be disposed on the second etch stop layer 133 and be connected to the second lower plug structure 154B. The first pad structure 255A may be disposed on the second etch stop layer 133 and be in direct contact with the first lower plug structure 154A. The second pad structure 255B may be disposed on the second etch stop layer 133 and be in direct contact with the second lower plug structure 154B.

The second insulating layer 61 may be disposed on the second etch stop layer 133 to cover the first and second interconnection structures 257A and 257B. The second insulating layer 61 may be in direct contact with side surfaces of the lower barrier layer 245, the aluminum layer 246, and the upper barrier layer 247. The third insulating layer 63 may be disposed on the second insulating layer 61. The first and second pad windows 66 and 67 may pass through the third insulating layer 63 and the second insulating layer 61 so that the first and second interconnection structures 57A and 57B may be exposed.

FIGS. 12 to 24 are cross-sectional views for describing a method of forming a semiconductor device according to an example embodiment of the inventive concepts.

Figure 12:
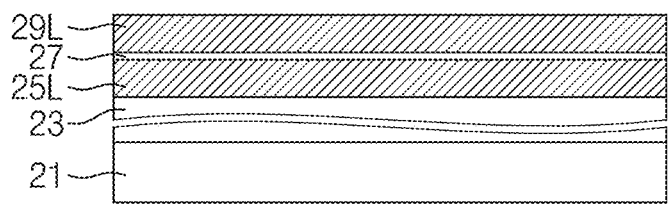
FIGS. 12 to 24 are cross-sectional views for describing a method of forming a semiconductor device according to an example embodiment of the inventive concepts.

Referring to FIG. 12, a lower insulating layer 23 may be formed on a substrate 21. The substrate 21 may include a silicon wafer or a semiconductor substrate such as a silicon-on-insulator (SOI) wafer. The lower insulating layer 23 may include silicon oxide, silicon nitride, silicon oxynitride, low-k dielectrics, high-k dielectrics, or a combination thereof. The lower insulating layer 23 may cover the substrate 21. A plurality of active/passive elements may be additionally formed on the substrate 21, but will be omitted for the sake of brevity.

A lower electrode layer 25L, a capacitor dielectric layer 27, and an upper electrode layer 29L may be sequentially stacked on the lower insulating layer 23. Each of the lower electrode layer 25L and the upper electrode layer 29L may include a metal, a metal silicide, a metal nitride, a metal oxide, a polysilicon, a conductive carbon, or a combination thereof. The capacitor dielectric layer 27 may include silicon oxide, silicon nitride, silicon oxynitride, high-k dielectrics, or a combination thereof. The capacitor dielectric layer 27 may be interposed between the lower electrode layer 25L and the upper electrode layer 29L. The capacitor dielectric layer 27 may be in direct contact with the lower electrode layer 25L and the upper electrode layer 29L.

Figure 13:
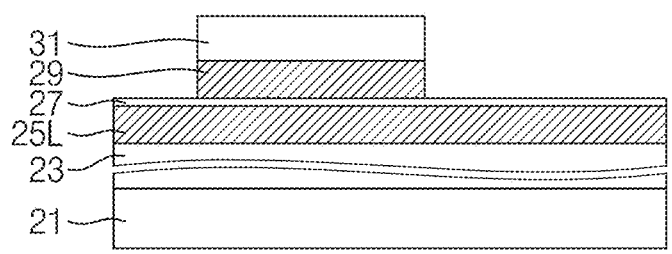

Referring to FIG. 13, the upper electrode layer 29L may be patterned using a first mask pattern 31 as an etch mask to form an upper electrode 29. The capacitor dielectric layer 27 may be exposed to an outer side of the upper electrode 29.

Figure 14:
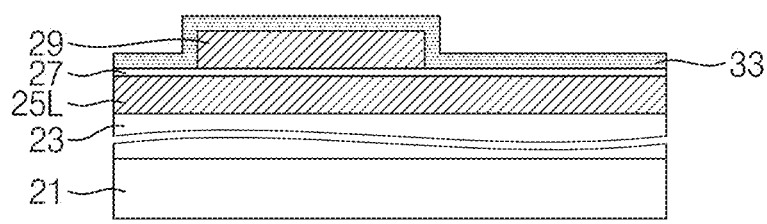

Referring to FIG. 14, an upper surface and side surfaces of the upper electrode 29 may be exposed by removing the first mask pattern 31. A first etch stop layer 33 may be formed on the substrate 21 having the upper electrode 29. The first etch stop layer 33 may cover the upper surface and the side surfaces of the upper electrode 29 and cover the capacitor dielectric layer 27. The first etch stop layer 33 may be omitted.

Figure 15:
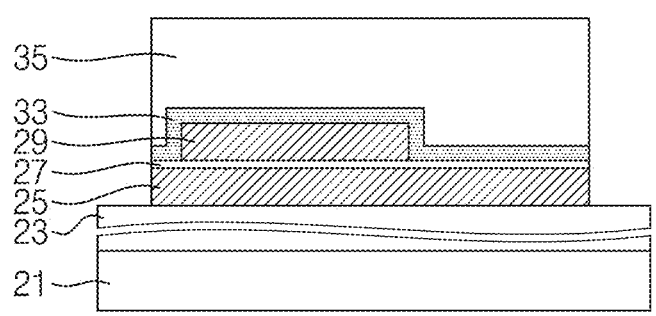

Referring to FIG. 15, the lower electrode layer 25L may be patterned using a second mask pattern 35 as an etch mask to form a lower electrode 25.

The first etch stop layer 33 and the capacitor dielectric layer 27 may also be partially removed during the formation of the lower electrode 25. The first etch stop layer 33 and the capacitor dielectric layer 27 may remain between the second mask pattern 35 and the lower electrode 25.

Figure 16:
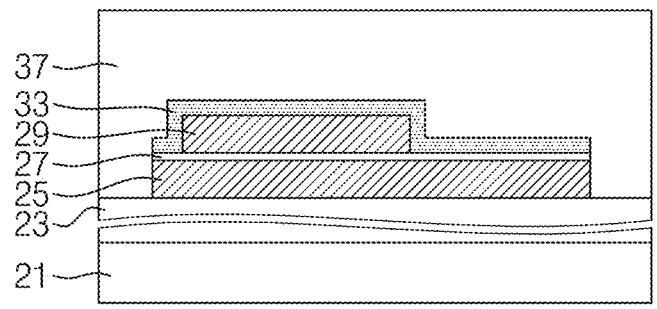

Referring to FIG. 16, an upper surface of the first etch stop layer 33 may be exposed by removing the second mask pattern 35. A first insulating layer 37 may be formed on the lower insulating layer 23. The first insulating layer 37 may cover an upper surface and side surfaces of the first etch stop layer 33, cover side surfaces of the capacitor dielectric layer 27, and cover side surfaces of the lower electrode 25.

Figure 17:
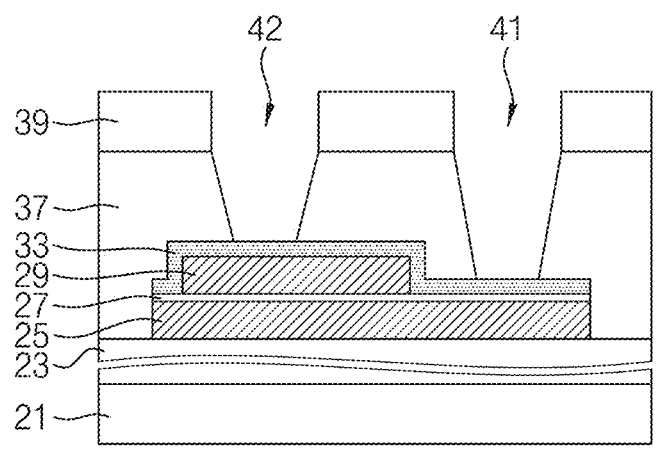

Referring to FIG. 17, the first insulating layer 37 may be patterned using a third mask pattern 39 as an etch mask to form first and second contact holes 41 and 42. The first contact hole 41 may be arranged on the lower electrode 25. The second contact hole 42 may be arranged on the upper electrode 29. The first etch stop layer 33 may be exposed to bottoms of the first and second contact holes 41 and 42.

The first etch stop layer 33 may include a different material from the first insulating layer 37. The first etch stop layer 33 may include a material having an etch selectivity with respect to the first insulating layer 37. The first insulating layer 37 may include silicon oxide, silicon nitride, silicon oxynitride, low-k dielectrics, or a combination thereof. In an example embodiment, the first etch stop layer 33 may include silicon nitride.

Figure 18:
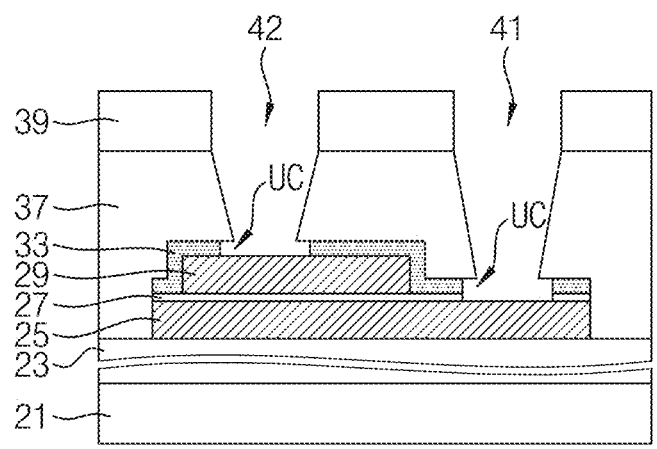

Referring to FIG. 18, the first etch stop layer 33 may be selectively removed to form undercut regions UC in lower regions of the first and second contact holes 41 and 42. The capacitor dielectric layer 27 may be partially removed in the lower region of the first contact hole 41. The lower electrode 25 may be exposed to a bottom of the first contact hole 41. The upper electrode 29 may be exposed to a bottom of the second contact hole 42.

Figure 19:
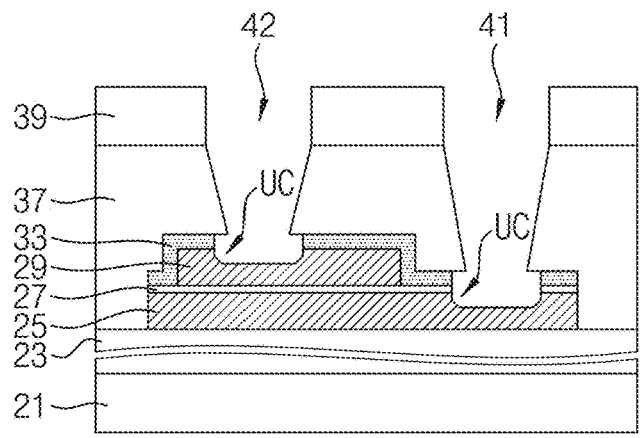

Referring to FIG. 19, the first and second contact holes 41 and 42 may extend into inner sides of the upper electrode 29 and the lower electrode 25 using an isotropic etching process. The bottom of the first contact hole 41 may be formed at a lower level than an uppermost end of the lower electrode 25. The bottom of the second contact hole 42 may be formed at a lower level than an uppermost end of the upper electrode 29.

Figure 20:
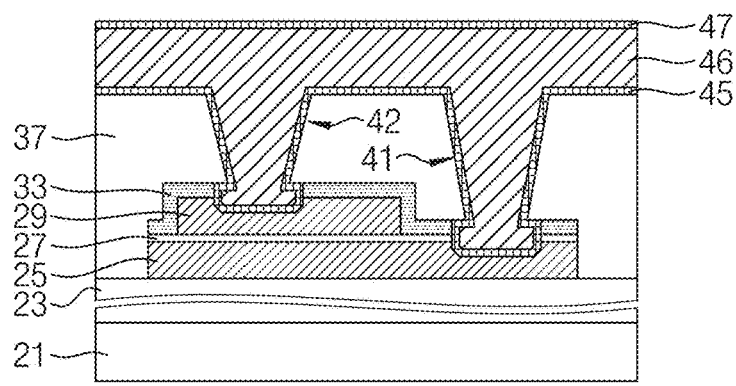

Referring to FIG. 20, an upper surface of the first insulating layer 37 may be exposed by removing the third mask pattern 39. A lower barrier layer 45, an aluminum layer 46, and an upper barrier layer 47 may be formed to fill the first and second contact holes 41 and 42 and cover the first insulating layer 37.

The lower barrier layer 45 may conformally cover inner walls of the first and second contact holes 41 and 42 and the first insulating layer 37. The lower barrier layer 45 may include Ti, TiN, Ta, TaN, or a combination thereof. The lower barrier layer 45 may be in direct contact with the upper electrode 29 and the lower electrode 25. The aluminum layer 46 may fully fill inner sides of the first and second contact holes 41 and 42 and may cover the first insulating layer 37. The aluminum layer 46 may be in direct contact with the lower barrier layer 45. The upper barrier layer 47 may cover the aluminum layer 46. The upper barrier layer 47 may include Ti, TiN, Ta, TaN, or a combination thereof. The aluminum layer 46 may be formed using a thin film process such as a physical vapor deposition (PVD) process.

Figure 21:
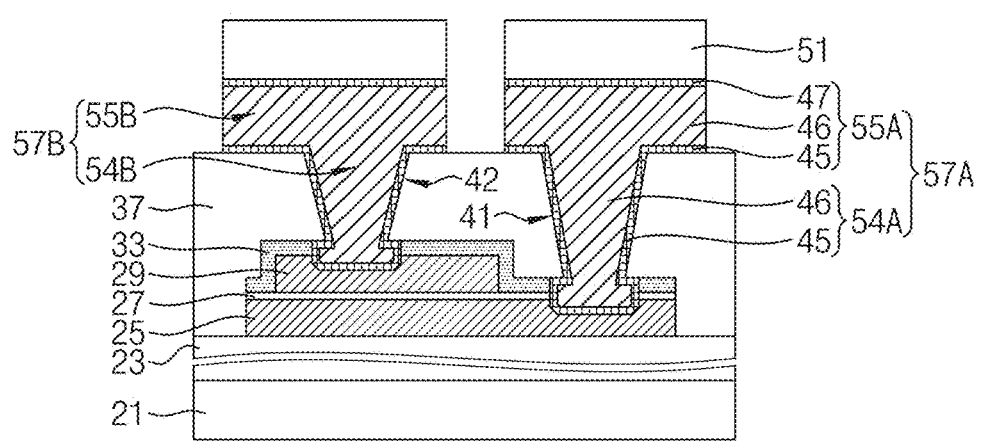

Referring to FIG. 21, the upper barrier layer 47, the aluminum layer 46, and the lower barrier layer 45 may be patterned using a fourth mask pattern 51 as an etch mask to form first and second interconnection structures 57A and 57B.

The first interconnection structure 57A may include a first plug structure 54A and a first pad structure 55A. The first plug structure 54A may be formed in the first contact hole 41. The first pad structure 55A may be formed on the first insulating layer 37 and be continuously formed on the first plug structure 54A. The second interconnection structure 57B may include a second plug structure 54B and a second pad structure 55B. The second plug structure 54B may be formed in the second contact hole 42. The second pad structure 55B may be formed on the first insulating layer 37 and be continuously formed on the second plug structure 54B.

Each of the first plug structure 54A and the second plug structure 54B may include the lower barrier layer 45 and the aluminum layer 46. The first plug structure 54A may extend into the lower electrode 25. A lowermost end of the first plug structure 54A may be formed at a lower level than the uppermost end of the lower electrode 25. In the first plug structure 54A, a lowermost end of the aluminum layer 46 may be formed at a lower level than the uppermost end of the lower electrode 25. The second plug structure 54B may extend into the upper electrode 29. A lowermost end of the second plug structure 54B may be formed at a lower level than the uppermost end of the upper electrode 29. In the second plug structure 54B, a lowermost end of the aluminum layer 46 may be formed at a lower level than the uppermost end of the upper electrode 29.

Each of the first pad structure 55A and the second pad structure 55B may include the lower barrier layer 45, the aluminum layer 46, and the upper barrier layer 47. In the first interconnection structure 57A, the aluminum layer 46 in the first plug structure 54A may be continuous with the aluminum layer 46 in the first pad structure 55A. In the second interconnection structure 57B, the aluminum layer 46 in the second plug structure 54B may be continuous with the aluminum layer 46 in the second pad structure 55B.

According to the example embodiments of the inventive concepts, the process of forming the aluminum layer 46 may include a thin film process such as a PVD process. The process of forming the first and second interconnection structures 57A and 57B may include the process of patterning the aluminum layer 46. The process of forming the first and second interconnection structures 57A and 57B may be simplified. The first and second interconnection structures 57A and 57B may exhibit improved or excellent electrical characteristics and/or higher reliability.

Figure 22:
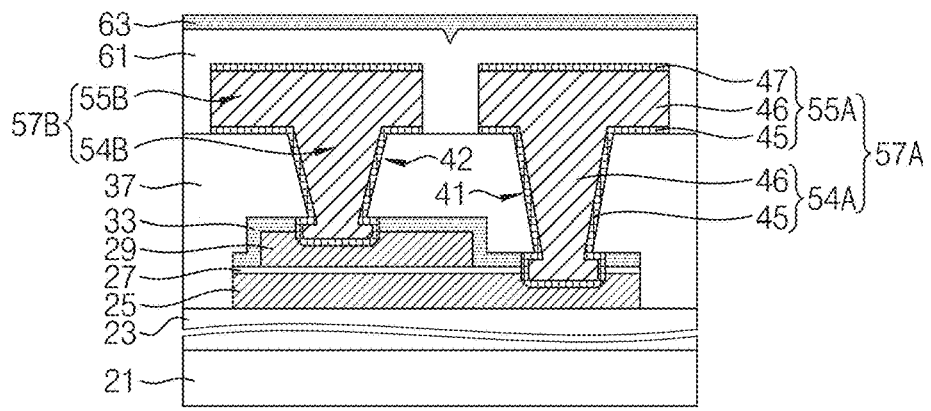

Referring to FIG. 22, upper surfaces of the first and second interconnection structures 57A and 57B may be exposed by removing the fourth mask pattern 51. A second insulating layer 61 may be formed on the first insulating layer 37 to cover the first and second interconnection structures 57A and 57B. A third insulating layer 63 may be formed on the second insulating layer 61. The third insulating layer 63 may include a different material from the second insulating layer 61. The second insulating layer 61 may include silicon oxide, silicon nitride, silicon oxynitride, low-k dielectrics, or a combination thereof. In an example embodiment, the third insulating layer 63 may include silicon nitride.

Figure 23:
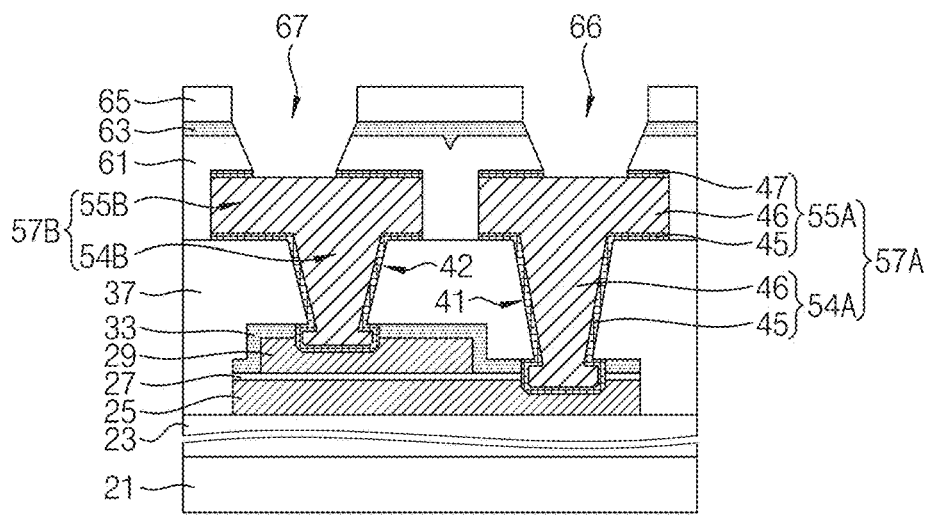

Referring to FIG. 23, first and second pad windows 66 and 67, which pass through the third insulating layer 63 and the second insulating layer 61, may be formed using a fifth mask pattern 65 as an etch mask.

The first pad window 66 may be formed on the first interconnection structure 57A. The first pad structure 55A may be exposed to a bottom of the first pad window 66. The upper barrier layer 47 may be partially removed during the formation of the first pad window 66. The aluminum layer 46 may be exposed to the bottom of the first pad window 66. The second pad window 67 may be formed on the second interconnection structure 57B. The second pad structure 55B may be exposed to a bottom of the second pad window 67. The upper barrier layer 47 may be partially removed during the formation of the second pad window 67. The aluminum layer 46 may be exposed to the bottom of the second pad window 67.

Figure 24:
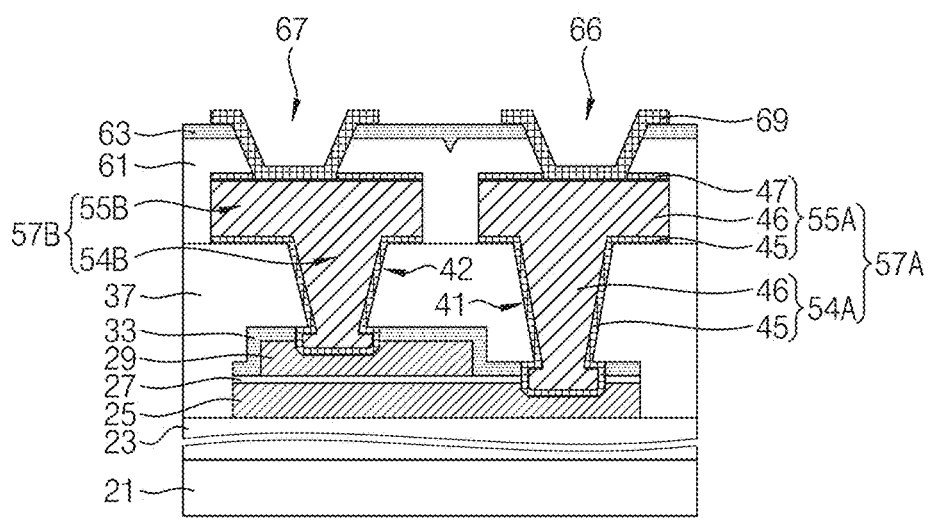

Referring to FIG. 24, an upper surface of the third insulating layer 63 may be exposed by removing the fifth mask pattern 65. A plurality of UBMs 69 may be formed in the first and second pad windows 66 and 67.

Each of the plurality of UBMs 69 may conformally cover an inner wall of a corresponding one of the first and second pad windows 66 and 67 and may extend on the third insulating layer 63. Each of the plurality of UBMs 69 may be connected to a corresponding one of the first and second interconnection structures 57A and 57B. The plurality of UBMs 69 may be in direct contact with the aluminum layer 46. The plurality of UBMs 69 may include Ni, Cu, Ti, Au, P, W, Cr, Al, or a combination thereof.

Referring again to FIG. 1, a fourth insulating layer 76 may be formed on the third insulating layer 63. The fourth insulating layer 76 may cover edges of the plurality of UBMs 69. The fourth insulating layer 76 may include silicon oxide, silicon nitride, silicon oxynitride, low-k dielectrics, or a combination thereof. A plurality of bumps 71 may be formed on the plurality of UBMs 69. The plurality of bumps 71 may include Sn, Ag, Cu, Au, In, or a combination thereof. The plurality of UBMs 69 and the plurality of bumps 71 may constitute a plurality of connection structures 73.

The substrate 21 having the plurality of connection structures 73 may be attached to a lower surface of a circuit board 81. The plurality of bumps 71 may be in contact with a plurality of lower terminals 83 of the circuit board 81. The plurality of lower terminals 83 may be connected to a plurality of upper terminals 87 via a plurality of internal interconnections 85. An encapsulant 89 may be formed on a lower surface of the circuit board 81. The encapsulant 89 may surround an upper surface, a lower surface, and side surfaces of the substrate 21. The plurality of bumps 71 may pass through the encapsulant 89 and be connected to the plurality of lower terminals 83. A plurality of external terminals 93 may be formed on the plurality of upper terminals 87. The circuit board 81 may be a multilayer printed circuit board including a plurality of interconnection layers and a plurality of insulating layers. The encapsulant 89 may include an epoxy molding compound (EMC).

According to example embodiments of the inventive concepts, interconnection structures, which are connected to a lower electrode and an upper electrode, are provided. Each of the interconnection structures has an aluminum layer. Connection structures are disposed on the interconnection structures. The interconnection structures having the aluminum layer can be advantageous in terms of simplification of a manufacturing process and/or improvement of reliability of a product. A semiconductor device having improved or excellent electrical characteristics and/or higher productivity can be implemented.

While embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device comprising:
   a first electrode on a substrate;
   a capacitor dielectric layer on the first electrode;
   a second electrode on the capacitor dielectric layer;
   a first insulating layer on the first and second electrodes and the capacitor dielectric layer;
   a first interconnection structure on the first insulating layer and connected to the first electrode at a first undercut region below the first insulating layer;
   a second interconnection structure on the first insulating layer and connected to the second electrode at a second undercut region below the first insulating layer;
   a second insulating layer on the first and second interconnection structures; and
   a plurality of connection structures configured to pass through the second insulating layer and connected to the first and second interconnection structures,
   wherein each of the first and second interconnection structures has an aluminum layer.

2. The semiconductor device of claim 1, wherein each of the first and second interconnection structures comprises:
   a pad structure on the first insulating layer and having the aluminum layer; and
   a plug structure configured to pass through the first insulating layer and having the aluminum layer,
   wherein the aluminum layer in the pad structure and the aluminum layer in the plug structure are an integrated type.

3. The semiconductor device of claim 2, wherein the plug structure is in direct contact with a corresponding one of the first and second electrodes.

4. The semiconductor device of claim 2, wherein the plug structure further comprises a lower barrier layer configured to surround a bottom and side surfaces of the aluminum layer.

5. The semiconductor device of claim 2, wherein the aluminum layer extends into the first electrode or the second electrode.

6. The semiconductor device of claim 2, wherein a lowermost end of the aluminum layer is at a lower level than an uppermost end of one, which is adjacent thereto, of the first and second electrodes.

7. The semiconductor device of claim 2, wherein the pad structure further comprises:
   an upper barrier layer on an upper surface of the aluminum layer; and
   a lower barrier layer on a lower surface of the aluminum layer.

8. The semiconductor device of claim 7, wherein the second insulating layer is in direct contact with side surfaces of the aluminum layer, the lower barrier layer, and the upper barrier layer.

9. The semiconductor device of claim 7, wherein each of the plurality of connection structures comprises:
   an under bump metallization (UBM); and
   a bump on the UBM,
   wherein the UBM is in direct contact with a corresponding one of the first and second interconnection structures.

10. The semiconductor device of claim 9, wherein the UBM passes through the upper barrier layer and is in direct contact with the aluminum layer.

11. The semiconductor device of claim 1, further comprising a circuit board on the plurality of connection structures.

12. The semiconductor device of claim 1, wherein the second insulating layer comprises:
    a first portion disposed between the first and second interconnection structures and in contact with the first insulating layer; and
    a second portion disposed between the plurality of connection structures and in continuity with the first portion.

13. A semiconductor device comprising:
    a first electrode on a substrate;
    a capacitor dielectric layer on the first electrode;
    a second electrode on the capacitor dielectric layer;
    a first insulating layer on the first and second electrodes and the capacitor dielectric layer;
    a first interconnection structure on the first insulating layer, passes through the first insulating layer, and is connected to the first electrode at a first undercut region below the first insulating layer;
    a second interconnection structure on the first insulating layer, passes through the first insulating layer, and is connected to the second electrode at a second undercut region below the first insulating layer;
    a second insulating layer on the first and second interconnection structures; and
    first and second pad windows configured to pass through the second insulating layer and expose the first and second interconnection structures,
    wherein each of the first and second interconnection structures has an aluminum layer.

* * * * *